(12) United States Patent
Chen

(10) Patent No.: US 6,482,641 B2
(45) Date of Patent: Nov. 19, 2002

(54) DNA-BASED INTEGRATED CIRCUIT

(76) Inventor: Boris Chen, 3F., 200, Sin-Yi Rd., Sec. 3, Taipei 106 (TW)

( * ) Notice: Subject to any disclaimer, the term of this patent is extended or adjusted under 35 U.S.C. 154(b) by 0 days.

(21) Appl. No.: 09/964,745

(22) Filed: Sep. 28, 2001

(65) Prior Publication Data

US 2002/0042151 A1 Apr. 11, 2002

(30) Foreign Application Priority Data

Oct. 2, 2000 (TW) ........................................ 89120427 A

(51) Int. Cl.⁷ ............................. C12M 1/34; C12Q 1/68; C12P 19/34; C07H 21/01; C07H 21/04
(52) U.S. Cl. ..................... 435/287.2; 435/6; 435/7.1; 435/91.1; 435/91.2; 536/22.1; 536/23.1; 536/24.3; 536/24.31; 536/24.32; 536/24.33
(58) Field of Search .......................... 435/6, 7.1, 91.1, 435/91.2, 287.2; 536/221, 23.1, 24.3–24.33

(56) References Cited

U.S. PATENT DOCUMENTS 6,214,628 B1 * 4/2001 Lakowicz et al.
6,221,586 B1 * 4/2001 Barton et al. ................... 435/6
6,248,529 B1 * 6/2001 Connolly ........................ 435/6
6,277,576 B1 * 8/2001 Meade et al. ................... 435/6

* cited by examiner

*Primary Examiner*—Jeffrey Siew
(74) *Attorney, Agent, or Firm*—Dennison, Schultz & Dougherty

(57) ABSTRACT

This Invention, a kind of DNA-based integrated circuit, with the DNA dyeing technology, the inlaying principle between anti-cancer medicine and DNA molecules, can change energy gap of DNA molecules to alter the conductivity of DNA molecules. Because that the diameter of DNA molecules is only about 2 nm, this kind of electronic element, which is not made with photolithography technologies, not only avoids the bottleneck of line width in production of photolithography-based ICs, but also limits the line width to 2 nm, much less than the minimum line width (0.13 μm or 130 nm) in semi-conductor production industry. It brings a practical approach to IC design beyond photolithography technologies, and ensures the development of ICs to microminiature predicted by the Moore Law.

12 Claims, 6 Drawing Sheets

DNA-BASED INTEGRATED CIRCUIT

BACKGROUND OF INVENTION

1. Field of the Invention

This invention, utilizing twin-DNA molecules as the substrate of semi-conductor elements, with the DNA dyeing technology, the inlaying principle between anti-cancer medicine and DNA molecules, changes energy gap of DNA molecules to alter the conductivity of DNA molecules; next, it links individual DNA electronic elements to form a meshwork.

2. Description of the Related Art

Integrated Circuits technology (ICs) is deemed as the destined trend of transistor technology, which was mainly developed by J. Kilby and R. Noyce in 1959. Though transistors substituted large electron tubes and reduced the size of circuits significantly, wiring between electronic elements is still done with welding technologies. With the expansion of circuits in size and amount, the requirement for quality is more and more strict. Therefore, the possibility of poor bonding increases drastically and it significantly affects the performance of circuits. With photolithography technologies, all electronic elements and necessary wiring can be integrated into a chip, which can greatly improve the quality of circuits and decrease the size of circuits. The influence of this technique is vast: Without the concept of IC, only transistor can be the substitute of electron tube. However, with the emergence of ICs, the whole electronic industry innovates to a new stage.

However, scientists have predicted the limit of photolithography technology as 0.1 $\mu$m. Therefore, some bottlenecks will occur if we continue the road of IC predicted by Moore Law on photolithography production technologies, unless we seek for other techniques.

DNA is the germ plasma controlling character of life forms. In 1953, J. Watson and F. Crick put forward the structure of DNA and the role of it in inheritance. A DNA is a long molecule comprising of pentose, phosphate groups and four kinds of basic groups (adenine (A), thymine (T), guanine (C), and cytosine (C)). The structure of a DNA is a double helix (2 nm in diameter), with a backbone of phosphate groups and deoxyriboses linked by phosphodiester bonds, and with basic side groups attached to the backbone. Every 10 basic groups form a loop with a 3.4 nm distance. Furthermore, basic groups are complementary to each other, i.e., A and T, G and C mate with a hydrogen bond separately. Therefore, you can learn the sequence of the other side from that of one side. For the structure of DNA, please refer to FIG. 1 and FIG. 2.

The complementary relationship between basic groups of a DNA entails good discrimination and combination of the two strings, and collocated with some self-assembled molecules, the DNA can be used as a kind of material for nanometer-scale devices. With special design of sequence, A DNA can be fabricated into a 3D, crossed or meshed framework (Seeman, N.C. (1982) J. Theoret. Biol. 99:237–247), as shown in FIG. 3. D. Porath proved on "Nature" in 2000 that when pure DNA molecules are used as a conduction material, the conduction range is within that of semi-conductors, as shown in FIG. 4.

By now, scientists have determined over 3 billion pairs of DNA sequences. And numerous articles related with the intermingle technique of this invention have been published in various medical and biochemical publications. There are also many processing methods to deposit DNA on metal. However, no one has put forth any method related with modifying the electricity of DNA and integrating DNA with metal after intermingle. Because that the diameter of a DNA molecule in only about 2 nm, electric elements made with this non-photolithography technology can not only avoid the bottleneck of line width in photolithography-based ICs, but also limit the minimum line width to 2 nm, which is much less than that (0.13 $\mu$m) in semi-conductor production industry. It brings a practical approach to IC design beyond photolithography technologies, and ensures the development of ICs to micro-miniature predicted by the Moore Law. Hereunder we will describe the detailed principle of this technique.

DETAILED DESCRIPTION OF EMBODIMENTS

1. DNA-Based Electronic Elements

D. D. Eley has investigated the electricity of many aromatic compounds, and he found that when $\pi$ electrons increases, the energy gap of semi-conductors will decrease. The energy gap of a crystal composed of 20$\pi$ electrons is about 1.5±0.5 eV, while that of 10$\pi$ electrons is about 3.0±1 eV.

In this case, it indicates that DNA is not a good conduction material. However, basic groups in vertical direction of the double helixes possess $\pi$ electrons, therefore, the orbit area of basic groups will overlap along the central axis, which can increase the conductivity of DNA molecules. Due to the double helix structure, when the two strings bond together, each basic group contains 20$\pi$ electrons. In the case of loose bond of DNA molecules, a basic group of each string of DNA contains 10$\pi$ electrons. Therefore, number of n electrons contained in basic groups of a DNA molecule are 10–20, and the energy gap is 1.5±0.5 eV–3.0±1 eV.

Because that DNA can be added with some foreign materials to increase conductivity, it can be used to design and manufacture semi-conductor elements. However, appropriate intermingle materials should be used to alter the electricity of DNA. Due to unique structure and characters of DNA molecules, both intermingle materials and intermingle processes are different to the production of traditional semi-conductors. Usually, intermingle materials can be some stains or anti-cancer drugs.

Figure 1:
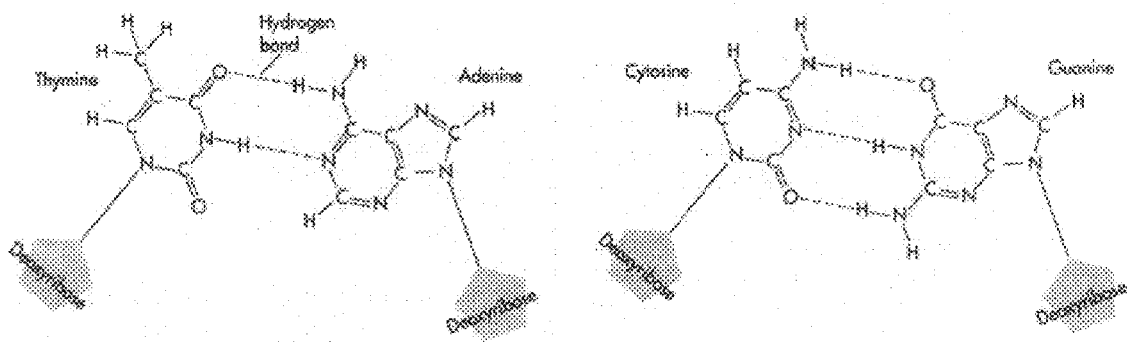
FIG. 1: Structure of DNA (A and T are bonded to each other with two hydrogen bonds, and G and C are bonded to each other with three hydrogen bonds)
Figure 2:
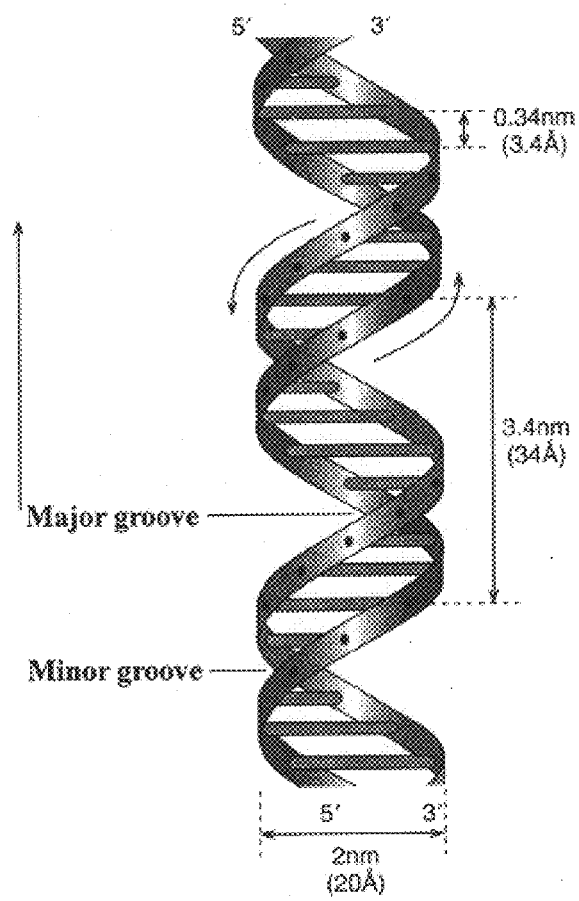
FIG. 2: Structure of DNA (every 10 bps form a loop with 3.4 nm distance; the diameter of a DNA is about 2 nm)
Figure 3:
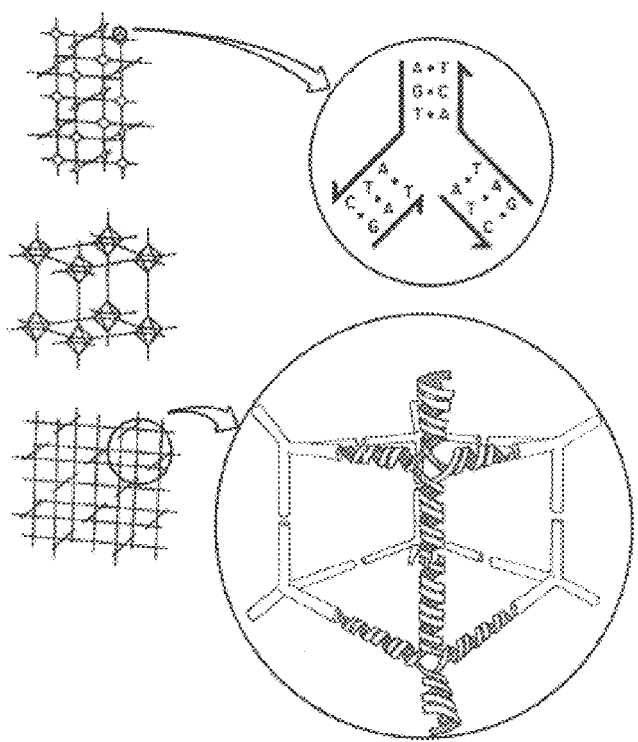
FIG. 3: a 3D Sketch Map of DNA
Figure 4:
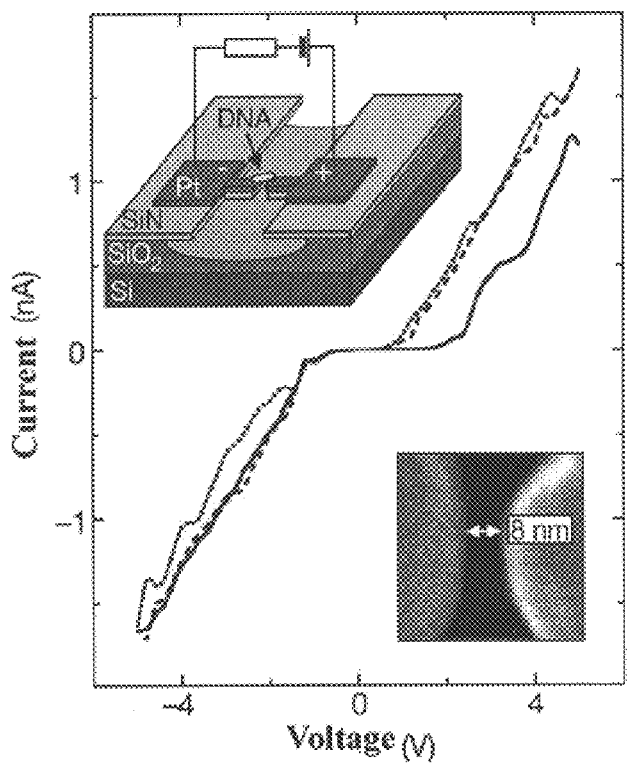
FIG. 4: adopted from "Nature 05/2000"
Figure 5:
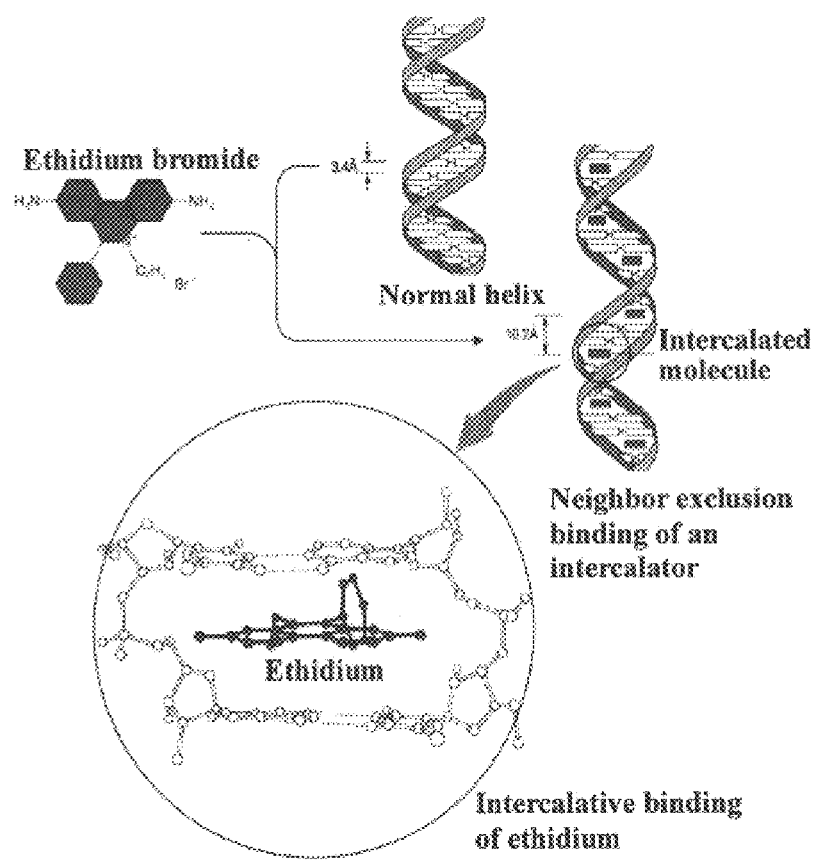
FIG. 5: Structure of DNA after Process with Ethidium Bromide (in X-Ray)

We have found that Intercalator is a kind of compound that can be added onto DNA molecules. Some planar aromatic ring positive ions, such as ethidium, can be inserted into the double helix structure of DNA, resulting in extension of DNA molecules and decrease in diameter. An intercalator molecule can be inserted at 1.02 nm interval. These compounds that can be added to DNA include: [Pt(terpyl)(SCH$_2$CH$_2$OH)]$^+$, [Pt(bpy)(en)]$^{2+}$, and [Pt(o-phen)(en)]$^{2+}$, etc. Besides, some planar metal complexes (metal loporphyrins), such as MPE-Fe(II) and [Pt(AO-en)Cl$_2$], etc., can be intermingles to DNA molecules, to alter the electricity of DNA. Please refer to FIG. 5.

Figure 6:
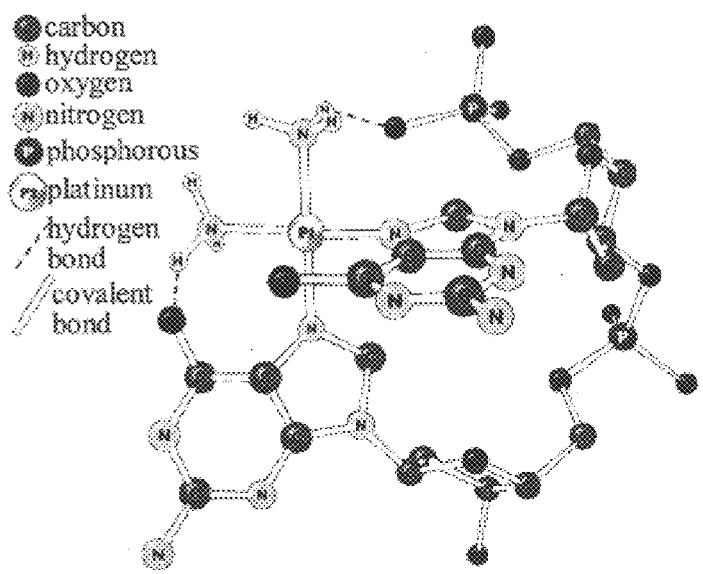
FIG. 6: Structure of DNA after Process with Cisplatin[Pt(terpy)(HET)]$_+$ (in X-Ray)

We found that when cisplatin is used to process DNA molecules, it can be added to N7 position of the two purines. Therefore, cisplatin can be used to process DNA molecules made from d(GpG) or d(ApG) to form the X-ray structure linked by cisplatin. Please refer to FIG. 6.

2. DNA Devices

Figure 7:
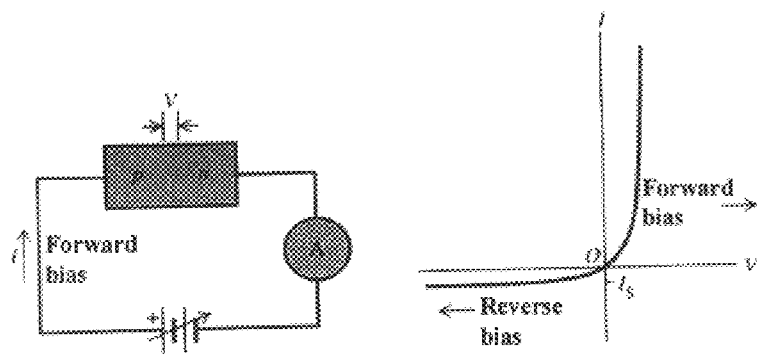
FIG. 7: Sketch Map of a p-n Rectifier

In many solid elements, intermingles of different characters and concentrations can be used to modify the features of semi-conductors. Then, with variation on electricity, necessary electron elements can be produced. For example, P-N Junction is the interconnecting section between materials with P adulterant and N adulterant. This method can guarantee that the current can only run in one direction in the elements, which is referred as diode rectifiers. The relationship between current and voltage is shown in FIG. 7. (University Physics, p.1365, FIG. 44-27).

Figure 8:
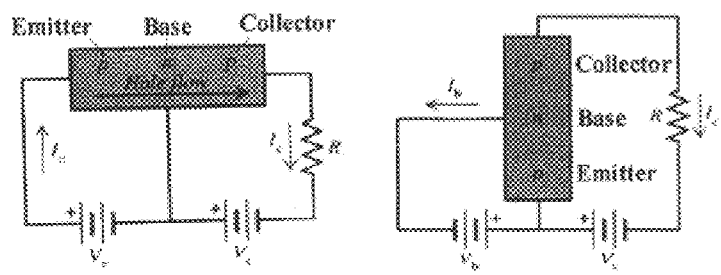
FIG. 8: Sketch Map of p-n-p and n-p-n Transistors
Figure 9:
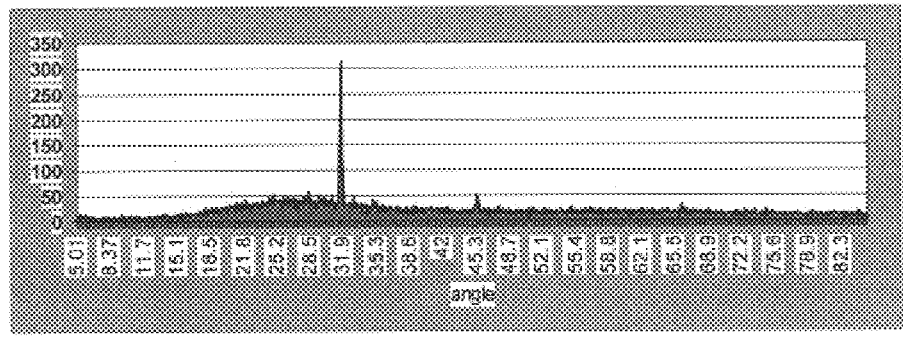
FIG. 9: DNA (in X-Ray Diffraction)
Figure 10:
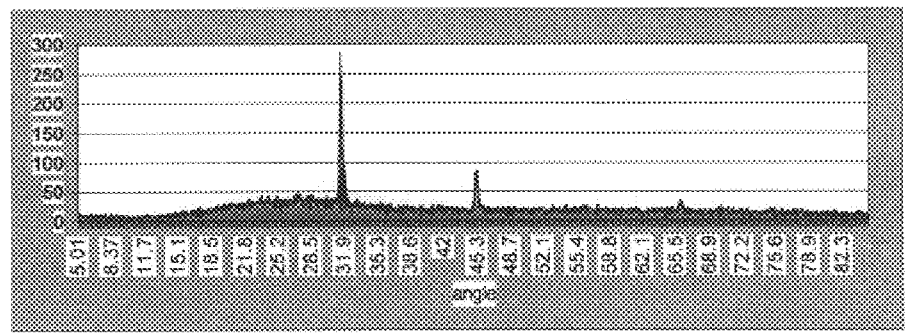
FIG. 10: Structure of DNA after Adulteration Process with [Pt(o-phen)(en)]$^{2+}$ (in-Ray Diffraction)
Figure 11:
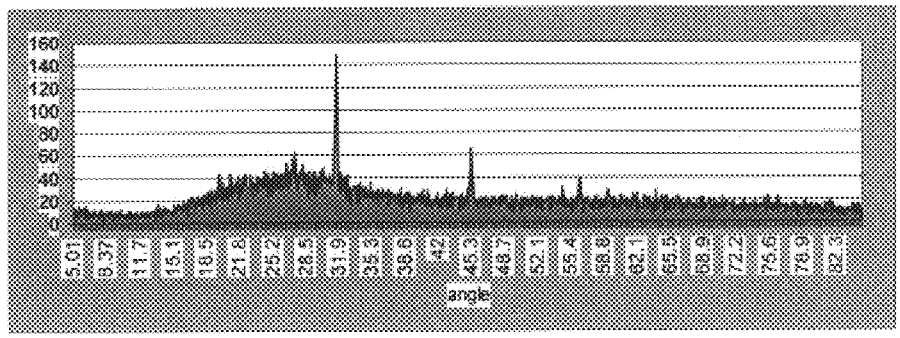
FIG. 11: Structure of DNA after Adulteration Process with ethidium (in X-Ray Diffraction).
Figure 12:
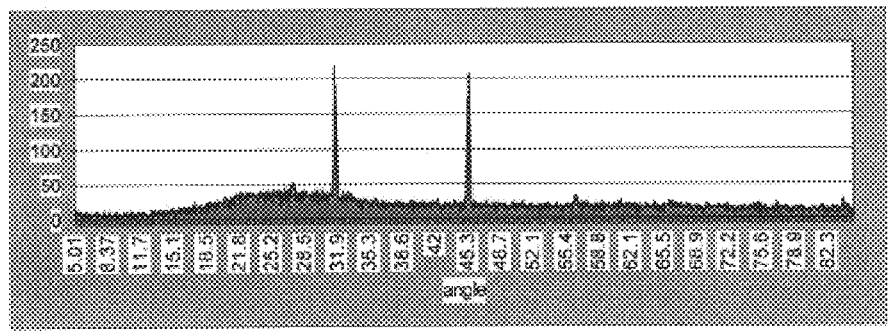
FIG. 12: Structure of DNA after Adulteration Process with Rh Complex (in X-Ray Diffraction)
Figure 13:
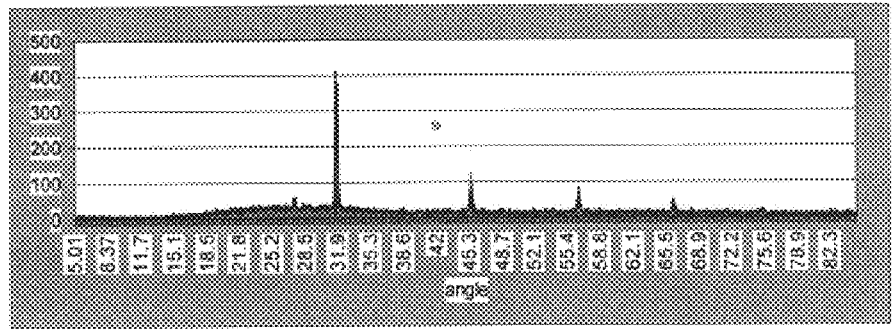
FIG. 13: Structure of DNA after Adulteration Process with [Pt(terpy1)(SCH$_2$CH$_2$)] (in X-Ray Diffraction)
Figure 14:
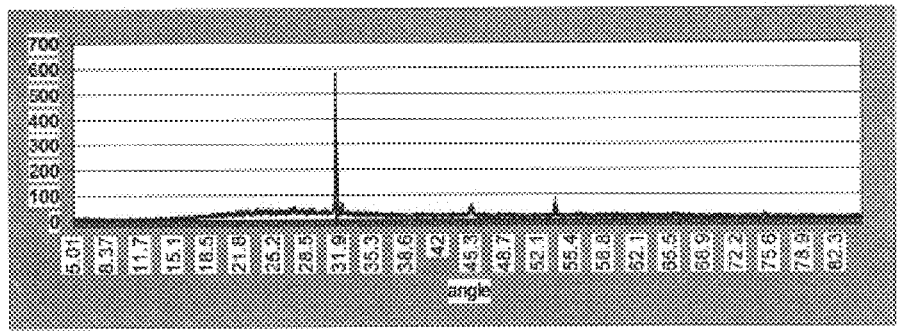
FIG. 14: Structure of DNA after Adulteration Process with cisplatin (in X-Ray Diffraction)

In 1948, Bell Labs announced a kind of bipolar junction transistor invented by Bardeen and W. Brattain. The electronic element comprises of two P-N Connecters, which adopt a sandwich structure and can be p-n-p or n-p-n. The three terminals are referred as emitter, base and collector. These electrical elements not only can be used as switches, but also as amplifiers. For detailed information, please refer to FIG. 8. (University Physics, p. 1368, FIG. 44-31, FIG. 44-32).

In the integration of DNA-based electronic elements we found that individual elements can be bonded with DNA, and p-n, p-n-p, and n-p-n features can be acquired through integration of DNA-based electronic elements with different electricity characters. For example, only 300 bp is occupied when a 100 bp element is added to a 200 bp element. Furthermore, most DNA elements are less than 20 bp in size (Note: 1 bp=0.34 nm), which is much less the size of a photolithography processed electrode (0.13 $\mu$m). And in fact, the DNA molecules across the two electrodes have already contained multi electronic elements. Therefore, the performance of an element can be determined through design of DNA sequence and different intermingle processes.

EXAMPLE

Example of Preparation and Integration of DNA-based Electronic Elements (1) Preparation of the DNA Sample
  A. Purchasing DNA strings from Perkin Elmer (Taiwan) Co, Ltd; 21 G(21 bp), 19 cs(19 bp), 16 cs(19 bp), pBR322-S14(14 bp), pBR322-3A1(17bp), pBR322-5S1(17bp), pBR322-3A2(18bp), pBR322-5S2(18bp)°
  B. Producing Twin-DNA molecules through PCR. Synthesize DNA with a commercial GeneAmp PCR Reagent Kit and a Ber Taq DNA polymerase Kit.
  C. Alcohol Sedimentation (separate DNA with other impurities utilizing extremely low solubility of DNA saline in alcohol)
    I. Add 10~20 $\mu$L3.0 sodium acetate to 1 ml solution and mix it.
    II. Add 1 ml alcohol (95%) and agitate, then place it in −20° C. environment for 30~40 minutes.
    III. In 4° C. room temperature, centrifuge for 10 minutes at 13,000 rpm. Then wipe off upper liquid carefully.
    IV. Add 0.5 ml alcohol to wash the DNA sediment, and then centrifuge for 10 minutes at 13,000 rpm In 4° C. room temperature. Again, wipe off upper liquid carefully, and we get the purified DNA.
(2) Adulterant Process (Dialysis)
  A. After the reaction between DNA and metal complex (or DNA stain or anti-cancer drug), in the 20 ml solution, 2 $\mu$M DNA and 10% metal complex exist. Then, add 10 mM sodium phosphate (pH7.0) and place it in 25° C. room temperature for 20 minutes.
  B. Get rid of redundant metal complex.
  C. Dialysis
    I. Load the DNA solution into a 1.5 ml centrifuge tube, take off the cover, and seal it with MW cut-Off 1,000 Daltons.
    II. Over turn the centrifuge tube and insert it into a 500 ml beaker with water and a muddler, and open the agitator to stir for 4 hours in 4° C. environment, and change the water every 1–2 hours.
    III. In 4° C. environment, centrifuge for 10 minutes at 13,000 rpm, and then get rid of the dialysis membrane, and put the DNA into a vacuum centrifuge drier to dry it.
(3) Integration of DNA-based Electronic Elements
  Bond processed DNA elements with the Klenow Fragment DNA Kit.
  A. Demarcate the 5' end of DNA with the Circum Vent Thermal Cycle Dideoxy DNA Sequencing Kit
  B. Bond DNA elements with the Klenow Fragment DNA Kit.
  C. Get rid of redundant metal complex with alcohol sedimentation.
  D. Drip some DNA solution onto a glass electrode plate laid over with gel, and add 2.5V DC for 80 minutes in −20° C. environment (arrange the order of DNA molecules with the principle that the electric field of gel can drive the negative electricity end of DNA), and then fix the DNA onto the Gold film plate.
  E. Lay the plate in a vacuum dryer horizontally to dehydrate DNA. Dried gel doesn't conduct electricity, and it serves as a seal layer as well.

Actual Proof

Test of Electricity and Integration of DNA-Based Electric Elements (Example 1)

Test of DNA-Based Electric Elements
(1) Preparation of Electrode for DNA Test: (Provided by Xulong Technologies)
Because the test of electricity of DNA elements should cooperate with state-of-the-art instruments, therefore, in this case, we deposited two gold electrodes in 130 nm distance on a glass plate with standard photolithography technology.

(2) Preparation of DNA Sample
  A. Purchase DNA strings (130 nm (328 bp) in length) from Life Gibco BRL.
  B. Produce twin-DNA molecules with PCR. Synthesize DNA with the GeneAmp PCR Reagent Kit and the Ber Taq DNA polymerase Kit.
  C. Alcohol Sedimentation (separate DNA with other impurities utilizing extremely low solubility of DNA saline in alcohol)

(3) Adulterant Process (Dialysis)
  A. After the reaction between DNA and metal complex (or DNA stain or anti-cancer drug), in the 20 ml solution, 2 μM DNA and 10% metal complex exist. Then, add 10 mM sodium phosphate (pH7.0) and place it in 25° C. room temperature for 20 minutes.
  B. Get rid of redundant metal complex.
  C. Dialysis
    I. Load the DNA solution into a 1.5 ml centrifuge tube, take off the cover, and seal it with MW cut-Off 1,000 Daltons.
    II. Over turn the centrifuge tube and insert it into a 500 ml beaker with water and a muddler, and open the agitator to stir for 4 hours in 4° C. environment, and change the water every 1–2 hours.
    III. In 4° C. environment, centrifuge for 10 minutes at 13,000 rpm, and then get rid of the dialysis membrane, and put the DNA into a vacuum centrifuge drier to dry it.
  D. Drip some DNA solution onto a glass electrode plate laid over with gel, and add 2.5V DC for 80 minutes in −20° C. environment (arrange the order of DNA molecules with the principle that the electric field of gel can drive the negative electricity end of DNA), and then fix the DNA onto the Gold film plate.
  E. Lay the plate in a vacuum dryer horizontally to dehydrate DNA. Dried gel doesn't conduct electricity, and it serves as a seal layer as well.

(4) X-Ray Diffraction
Investigate the crystal lattice of complex of DNA and adulterant. For the result of X-Ray diffraction, please refer to FIG. 9, 10, 11, 12, 13, and 14.

(5) Measurement of Electricity
Measure the energy gap (eV) of DNA after adulteration with a semi-conductor parameter measuring and analyzing system (HP 4194) and the processed glass plate.

TABLE

Energy Gap (eV) measured with HP4194

| DNA-Based Electric Element | Energy Gap (eV) |
|---|---|
| DNA | 2.27 ± 0.02 |
| DNA (processed with Cisplatin) | 0.23 ± 0.02 |
| DNA (processed with [Pt(terpyl)(SCH$_2$CH$_2$)]) | 2.91 ± 0.02 |
| DNA (processed with Ethidium) | 3.44 ± 0.02 |
| DNA (processed with [Pt(bpy)(en)]$^{2+}$) | 1.54 ± 0.02 |
| DNA (processed with [Pt(o-phen)(en)]$^{2+}$) | 3.23 ± 0.02 |
| DNA (processed with Rh complex) | 3.01 ± 0.02 |
| DNA (processed with MPE-Fe(II)) | 1.56 ± 0.02 |
| DNA (processed with Ethiduim + cisplatin) | 0.01 ± 0.02 |

Test of Electricity and Integration of DNA-Based Electric Elements (Example 2)

Test of DNA-Based Electric Elements
(1) Preparation of Electrode for DNA Test:
  A. Purchase DNA strings from Perkin Elmer (Taiwan) Co., Ltd 21 G(21 bp), 19 cs(19 bp), 16 cs(19 bp), pBR322-S14(14 bp), pBR322-3A1(17 bp), pBR322-5S1(17 bp), pBR322-3A2(18 bp), pBR322-5S2(18 bp)°
  B. Produce twin-DNA molecules with PCR.
  C. Alcohol Sedimentation (separate DNA with other impurities utilizing extremely low solubility of DNA saline in alcohol)

(2) Adulterant Process (Dialysis)
(3) Integration of DNA-Based Electric Elements
  A. Bond processed DNA elements with the Klenow Fragment DNA Kit. Demarcate the 5' end of DNA with the Circum Vent Thermal Cycle Dideoxy DNA Sequencing Kit
  B. Bond DNA elements with the Klenow Fragment DNA Kit. And get rid of redundant metal complex with alcohol sedimentation.
  C. Carry out electrophoresis process with Agarose Gel.

Figure 15:
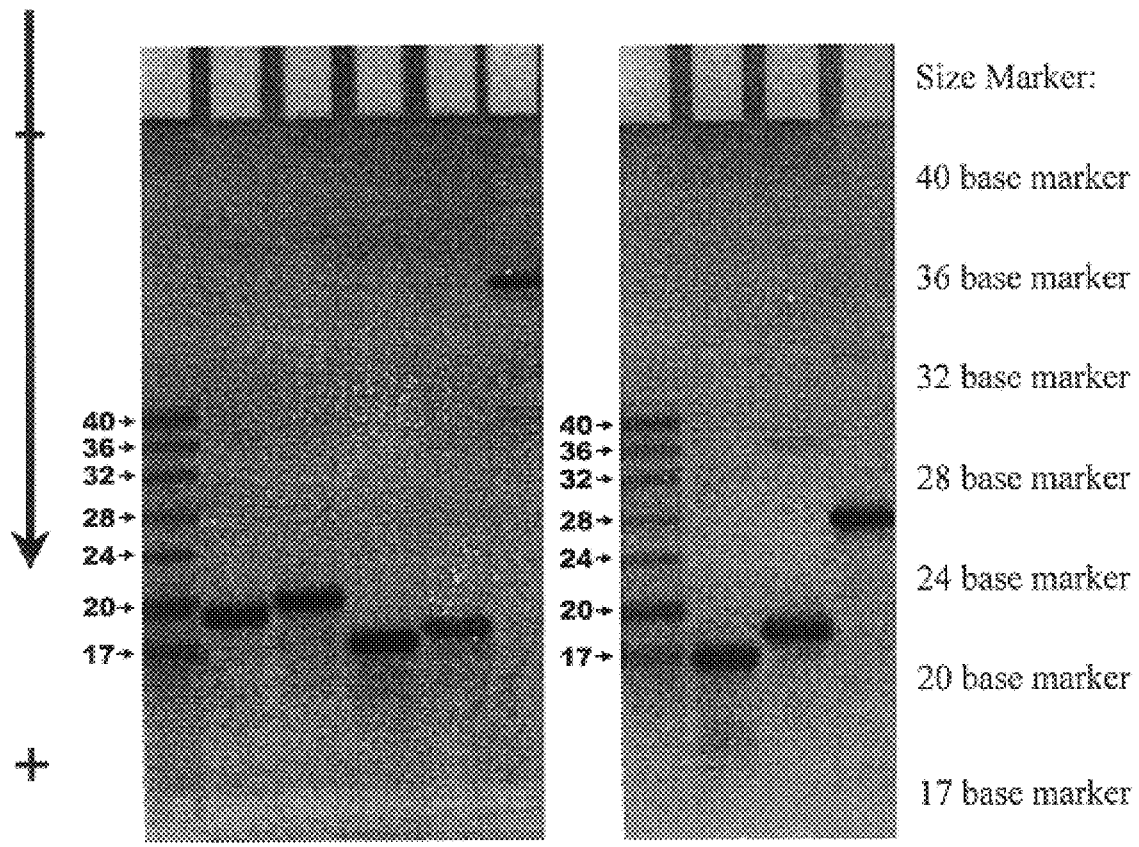
FIG. 15: Result of Electrophoresis after integration

The result of above electrophoresis process is shown in FIG. 15.

From the picture we can see that DNA-based electronic components can be bonded together.

Relative position of Integrated DNA elements in the electrophoresis:
  Conditions: 20% acrylamide containing 7M urea
  Buffer: 1 XTBE (89 mM Tris, 89 mM boric acid, 2.5 mM EDTA)
  Loading buffer: formamide: 10 XTBE=9.1
  Voltage: 200V 1) 19 bp (processed with cisplatin) 1) 4 bp (processed with [Pt(bpy)(en)]$^{2+}$)
2) 21 bp (unprocessed) 2) 18 bp (processed with [Pt(o-phen)(en)]$^{2+}$)
3) 17 bp (processed with ethidium) 3) DNA (resulted from 1) and 2)
4) 18 Base (processed with MPE-Fe(II))
5) DNA (resulted from 1), 2), 3), and 4))

After integration, the position of DNA in electrophoresis deviates more than it is expected. It is because that the misproportion of electricity of integrated elements (the conductivity of each plate is different).

What is claimed is:
1. A method of manufacturing a DNA-based integrated circuit, comprising
  (a) obtaining a sample of double-stranded DNA;
  (b) adulterating the double-stranded DNA with a compound which is able to alter the electrical conductivity of the DNA to form a plurality of adulterated DNA-based electronic elements, whereby said compound changes the number of π electrons between bases in the DNA, and wherein the energy gap of the adulterated DNA is in the range of from about 0.01±0.02 to about 3.44⊥0.02 eV in the DNA;
  (c) ligating the said DNA-based electronic elements to form a network of DNA-based electronic elements; and
  (d) binding said network of DNA-based electronic elements to a substrate to form the integrated circuit.

2. A method according to claim 1 wherein the compound which able to alter the electrical conductivity of DNA is selected from the group consisting of an intercalator, a compound having a planar cationic aromatic ring, a planar metal complex, an anti-tumor compound and a stain.

3. A method according to claim 2 wherein the intercalator is selected from the group consisting of ethidium, [Pt(terpyl)(SCH$_2$CH$_2$OH)]$^+$, [Pt(bpy)(en)]$^{2+}$ and [Pt(o-phen)(en)]$^{2+}$.

4. A method according to claim 2 wherein the compound having a planar cationic aromatic ring is ethidium.

5. A method according to claim 1 wherein the planar metal complex is selected from the group consisting of rhodium complex, MPE-Fe(II) and [Pt(AO-en)Cl$_2$].

6. A method according to claim 1 wherein the anti-tumor compound is cisplatin.

7. A method according to claim 6, wherein cisplatin is added to the N7-position of two purine molecules in the DNA.

8. A method according to claim 1 wherein the substrate to which the network of DNA-based elements is bound is a gold film plate.

9. A method according to claim 1 wherein the orbit areas of basic groups in the adulterated DNA are extended and overlap.

10. A method according to claim 1 wherein ligase is used to ligate the individual electronic elements.

11. A method according to claim 1 wherein the integrated circuit is a semi-conductor.

12. A DNA-based integrated circuit produced according to the method of claim 1.

* * * * *